US008101973B2

(12) United States Patent
O'Keefe et al.

(10) Patent No.: US 8,101,973 B2
(45) Date of Patent: *Jan. 24, 2012

(54) TRANSISTOR

(75) Inventors: Matthew Francis O'Keefe, Aycliffe Village (GB); Robert Grey, Newton Aycliffe (GB); Michael Charles Clausen, Newton Aycliffe (GB); Richard Alun Davies, Darlington (GB)

(73) Assignee: RFMD (UK) Limited, Newton Aycliffe (GB)

( * ) Notice: Subject to any disclaimer, the term of this patent is extended or adjusted under 35 U.S.C. 154(b) by 117 days.

This patent is subject to a terminal disclaimer.

(21) Appl. No.: 12/057,134

(22) Filed: Mar. 27, 2008

(65) Prior Publication Data
US 2008/0237643 A1    Oct. 2, 2008

(30) Foreign Application Priority Data
Mar. 28, 2007    (GB) .................................. 0705918.1

(51) Int. Cl.
*H01L 29/66*    (2006.01)
(52) U.S. Cl. .. 257/197; 257/198; 257/477; 257/E29.189
(58) Field of Classification Search .................. 257/197, 257/198, 477, E29.189
See application file for complete search history.

(56) References Cited

U.S. PATENT DOCUMENTS

| 5,837,589 A | 11/1998 | McNamara et al. |
| 6,046,486 A * | 4/2000 | McNamara et al. .......... 257/477 |
| 6,258,685 B1 | 7/2001 | Fujita et al. |
| 2002/0088993 A1* | 7/2002 | Twynam et al. .............. 257/192 |
| 2004/0200523 A1* | 10/2004 | King et al. .................... 136/262 |
| 2006/0081963 A1 | 4/2006 | Rehder et al. |

FOREIGN PATENT DOCUMENTS

| EP | 1225638 A2 | 7/2002 |
| EP | 1225638 A3 | 2/2003 |
| EP | 1662557 A1 | 5/2006 |
| GB | 2415292 | 12/2005 |
| JP | 2000340576 | 5/1999 |
| JP | 2007027294 | 7/2005 |

OTHER PUBLICATIONS

Publication entitled High-current-gain in AlP/AlGaAsSb/InP HBTs with a compositionally-graded AlGaAsSb base grown by MOCVD; by Yasuhiro Oda, Kenji Kurishima, Noriyuk Watanabe, Masahiro Uchida and Takashi Kobayashi from The British Library "The Words Knowledge". Search Report from Application No. GB0705918.1, dated Jan. 24, 2008.

* cited by examiner

*Primary Examiner* — Tan N Tran
(74) *Attorney, Agent, or Firm* — Withrow & Terranova, P.L.L.C.

(57) ABSTRACT

A heterojunction bipolar transistor comprising
a substrate;
a collector on the substrate;
a base layer on the collector;
an emitter layer on the base layer;
the emitter layer comprising an upper emitter layer and a lower emitter layer between the upper emitter layer and base;
the collector, base and emitter layers being npn or pnp doped respectively; characterized in that
the lower emitter layer has a larger bandgap than the base layer and is $Al_xIn_{1-x}P$ or $Ga_xAl_{1-x}P$, x being in the range $0^+$ to 1.

40 Claims, 16 Drawing Sheets

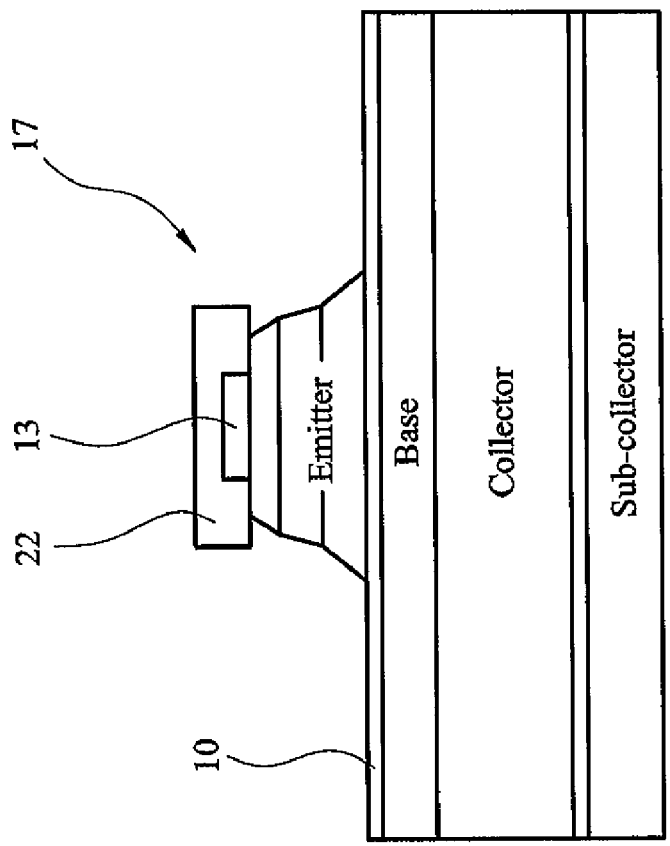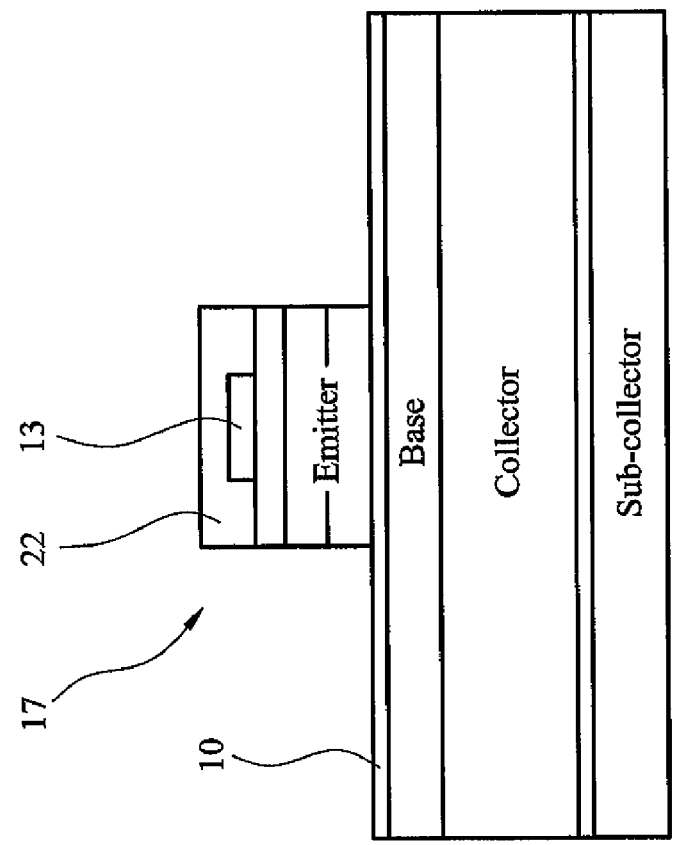
FIG. 9

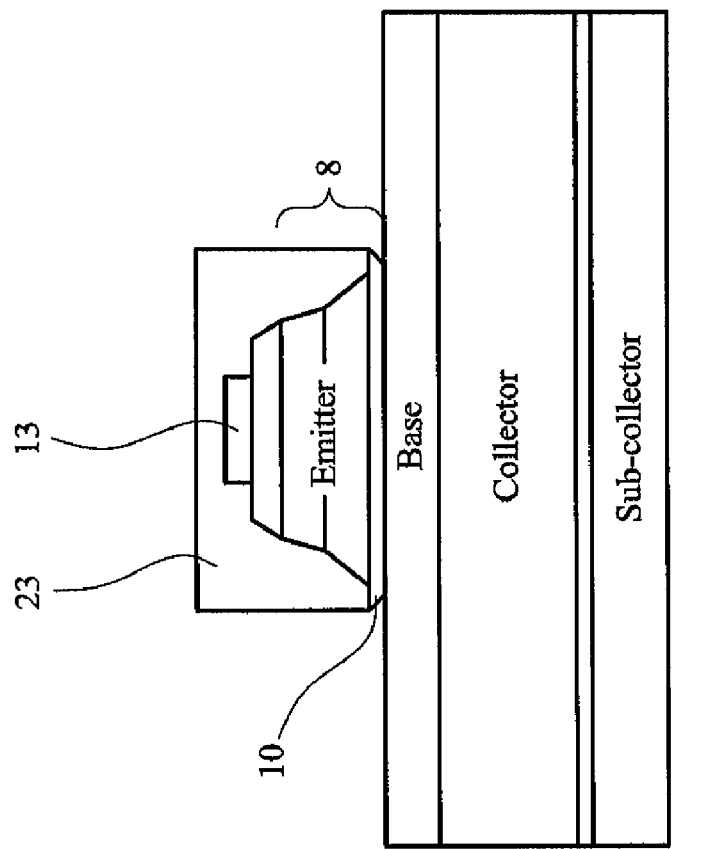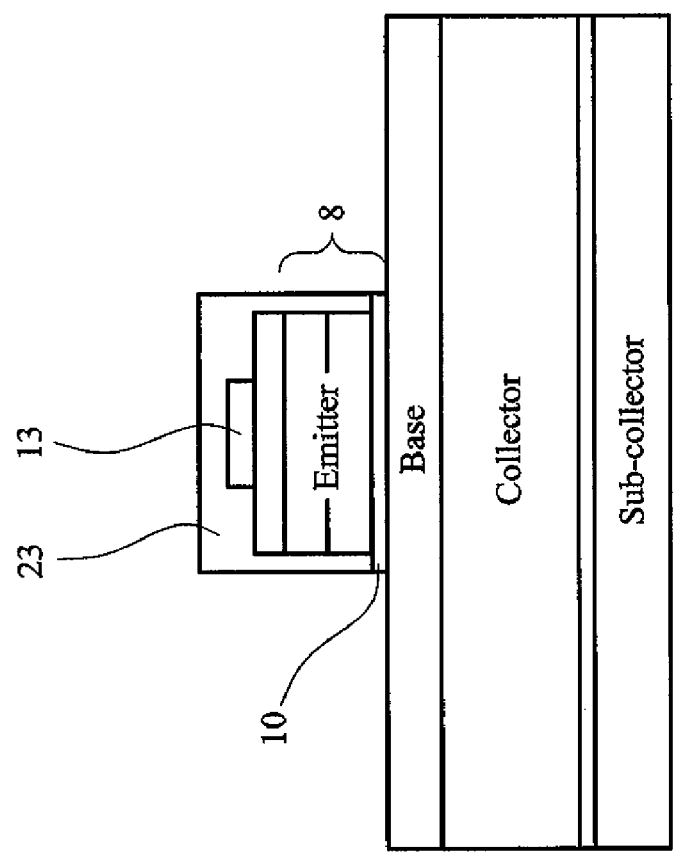
FIG. 10

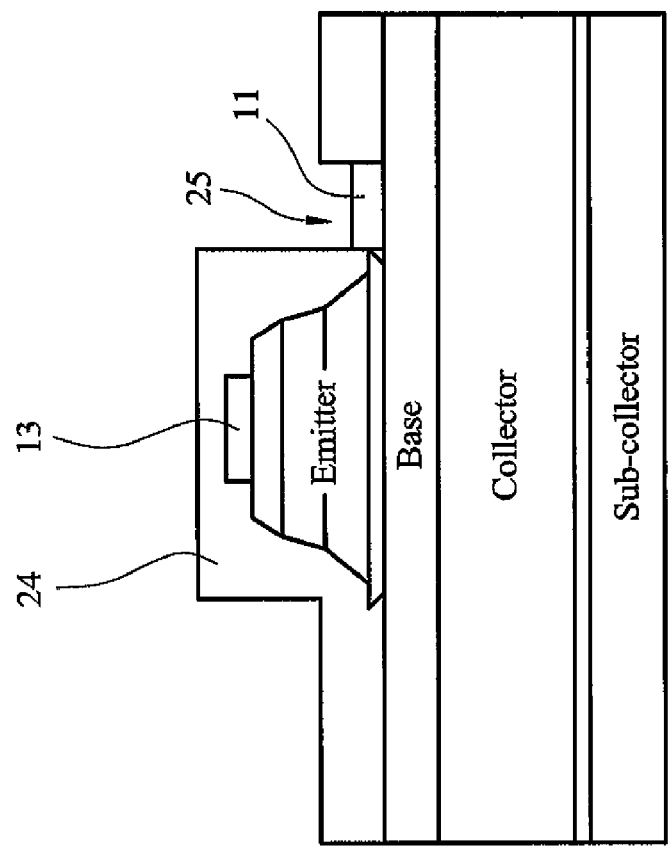
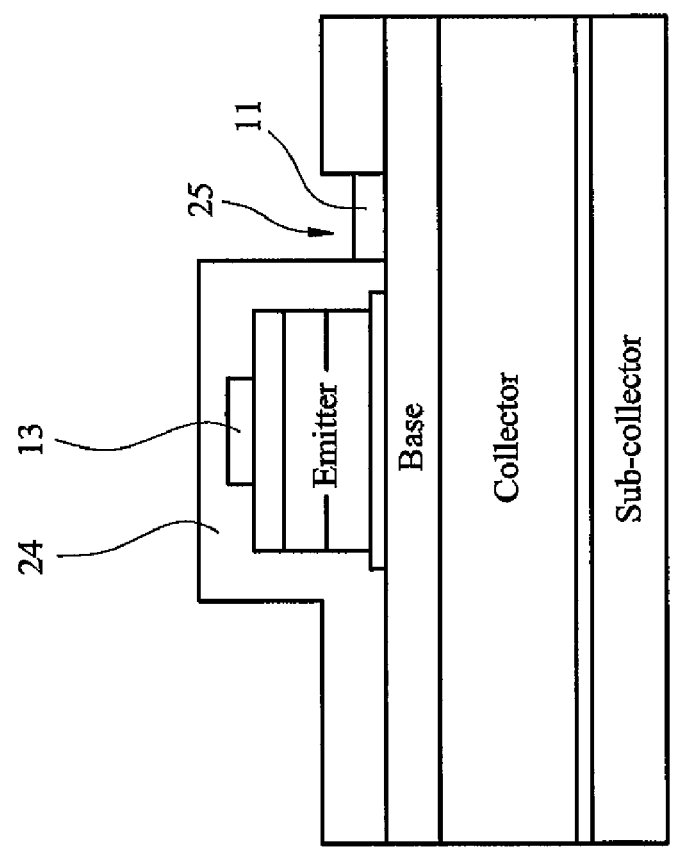
FIG. 11

TRANSISTOR

The subject patent application claims priority to and all the benefits of United Kingdom Patent Application No. 0705918.1, which was filed on Mar. 28, 2007 with The UK Patent Office.

The present invention relates to a heterojunction bipolar transistor. More particularly, but not exclusively, the present invention relates to a heterojunction bipolar transistor having a lower emitter layer on a base layer, the lower emitter layer having a larger band gap than the base layer and comprising AlInP or GaAlP. The present invention also relates to a multilayer semiconductor wafer incorporating AlInP or GaAlP.

Heterojunction bipolar transistors (HBTs) are known. HBTs are used for digital and analogue microwave applications at high frequencies. HBTs provide faster switching speeds than silicon bipolar transistors mainly due to reduced base resistance and collector to substrate capacitance.

HBT performance depends upon the geometry of the base emitter junction. Typically an etch stop layer is laid down between the emitter and the base. Wet and dry etchants etch the layers above the etch stop layer in slightly different ways so affecting the geometry of the base emitter junction and hence the performance of the HBT. Current methods of HBT manufacture are however limited to either wet etching one type of wafer or dry etching another.

The heterojunction bipolar transistor according to the invention seeks to overcome this problem.

Accordingly in a first aspect, the present invention provides a heterojunction bipolar transistor comprising
  a substrate;
  a collector on the substrate;
  a base layer on the collector;
  an emitter layer on the base layer;
  the emitter layer comprising an upper emitter layer and a lower emitter layer between the upper emitter layer and base;
  the collector, base and emitter layers being npn or pnp doped respectively;
    characterised in that
    the lower emitter layer has a larger bandgap than the base layer and is $Al_xIn_{1-x}P$ or $Ga_xAl_{1-x}P$, x being in the range $0^+$ to 1.

The layers above the AlInP or GaAlP lower emitter layer can be etched by either a wet or dry chemistry, depending on the HBT characteristics required. This allows a wide choice of fabrication techniques with only the control chemistry itself required to be changed. In previous methods and devices the etch stop layer for the starting wafer had to be chosen depending on whether a wet etch chemistry or dry etch chemistry was to be used in manufacture of the HBT. One therefore had to know the final product even before manufacturing the starting wafer. The HBT according to the invention overcomes the problem by allowing the use of a wet or dry etch chemistry depending on the precise result required.

Preferably, the lower emitter layer is $Al_xIn_{1-x}P$.
Alternatively, the lower emitter layer is $Ga_xAl_{1-x}P$.
x can be in the range 0.05 to 0.95, more preferably in the range 0.4 to 0.6, more preferably 0.5.

The composition of the lower emitter layer can vary through the thickness of the layer.

The transistor can be an npn transistor with the collector and emitter being n doped and the base being p doped.

Alternatively, the transistor can be a pnp transistor with the collector and emitter being p doped and the base being n doped.

The upper emitter layer can be GaAs.

The emitter can further comprise an AlGaAs grading layer between the GaAs upper emitter layer and the lower emitter layer.

The heterojunction bipolar transistor according to the invention can further comprise an InGaAs contact layer on the emitter layer.

The heterojunction bipolar transistor according to the invention can further comprise an emitter electrode on the contact layer.

Preferably, the heterojunction bipolar transistor according to the invention further comprises an InGaAs graded composition layer between the InGaAs contact layer and the emitter layer.

The heterojunction bipolar transistor according to the invention can further comprise a base electrode on the base layer.

Preferably, the lower emitter layer extends beyond the upper emitter layer in the plane of the base to form a covering layer on the base, the heterojunction bipolar transistor further comprising a base electrode on the covering layer.

The base layer can be $Ga_{1-x}In_xAs_{1-y}N_y$, with x and y both being in the range 0 to 1.

Preferably, the base is GaAs.

The collector can be GaAs.

Preferably, the collector is divided into an upper collector portion and a subcollector portion.

The upper collector portion can be n-GaAs and the subcollector can be $n^+$GaAs.

Preferably, the heterojunction bipolar transistor according to the invention comprises an etch stop layer between the upper collector and sub collector portions.

The etch stop layer can comprise $Al_xIn_{1-x}P$, x being in the range $0^+$ to 1, preferably 0.05 to 0.95, more preferably 0.4 to 0.6, more preferably 0.5.

Alternatively, the etch stop layer can comprise $Ga_xIn_{1-x}P$, x being in the range $0^+$ to 1, preferably 0.05 to 0.95, more preferably 0.4 to 0.6, more preferably 0.5.

Preferably, the heterojunction bipolar transistor according to the invention further comprises a collector electrode on the subcollector portion.

The substrate can be a semi insulating GaAs substrate.

In a further aspect of the invention there is provided a multilayer semiconductor wafer comprising
  a substrate;
  a collector layer on the substrate;
  a base layer on the collector;
  an emitter layer on the base layer;
  the emitter layer comprising an upper emitter layer and a lower emitter layer between the upper emitter layer and base;
  the collector, base and emitter layers being npn or pnp doped respectively;
    characterised in that
    the lower emitter layer has a larger bandgap than the base layer and is $Al_xIn_{1-x}P$ or $Ga_xAl_{1-x}P$, x being in the range $0^+$ to 1.

The lower emitter layer can be $Al_xIn_{1-x}P$.
Alternatively, the lower emitter layer is $Ga_xAl_{1-x}P$.
Preferably, x can be in the range 0.05 to 0.95, more preferably in the range 0.4 to 0.6, more preferably x is 0.5.

The upper emitter layer can be GaAs.

The multilayer semiconductor wafer according to the invention can further comprise an AlGaAs grading layer between upper emitter layer and lower emitter layer.

The multilayer semiconductor wafer according to the invention can further comprise an InGaAs contact layer on the upper emitter layer.

Preferably, the multilayer semiconductor wafer according to the invention further comprises an InGaAs graded composition layer between the contact layer and upper emitter layer.

Preferably, the collector and emitter layers are n doped and the base layer is p doped.

Alternatively, the collector and emitter layers are p doped and the base layer is n doped.

In a further aspect of the invention there is provided a method of manufacture of a heterojunction bipolar transistor comprising the steps of:

(a) providing a multilayer semiconductor wafer, the multilayer semiconductor wafer comprising:
   a substrate;
   a collector layer on the substrate;
   a base layer on the collector;
   an emitter layer on the base layer;
   the emitter layer comprising an upper emitter layer and a lower emitter layer between the upper emitter layer and base;
   the collector, base and emitter layers being npn or pnp doped respectively;
   characterised in that
   the lower emitter layer has a larger bandgap than the base layer and is $Al_xIn_{1-x}P$ or $Ga_xAl_{1-x}P$, x being in the range $0^+$ to 1;

(b) etching the wafer through the upper emitter layer to the lower emitter layer using either a wet or dry etch.

Preferably, the method further comprises the step of etching through the lower emitter layer using either a wet or a dry etch to expose a portion of the base.

Preferably, the method further comprises the step of etching through the base to expose a portion of the collector.

Preferably, the collector comprises a subcollector portion on the substrate, an upper collector portion on the subcollector portion and a lower etch stop layer sandwiched between the subcollector portion and upper collector portion, the step of etching through the base further comprising etching through the upper collector portion to the lower etch stop layer by either a wet or a dry etch.

Preferably, the method further comprises the step of depositing an ohmic metal contact on the emitter.

The present invention will now be described by way of example only, and not in any limitative sense in which:

FIGS. 8 to 16 show a method of manufacture of an HBT according to the invention by wet and dry etching routes.

Figure 1:
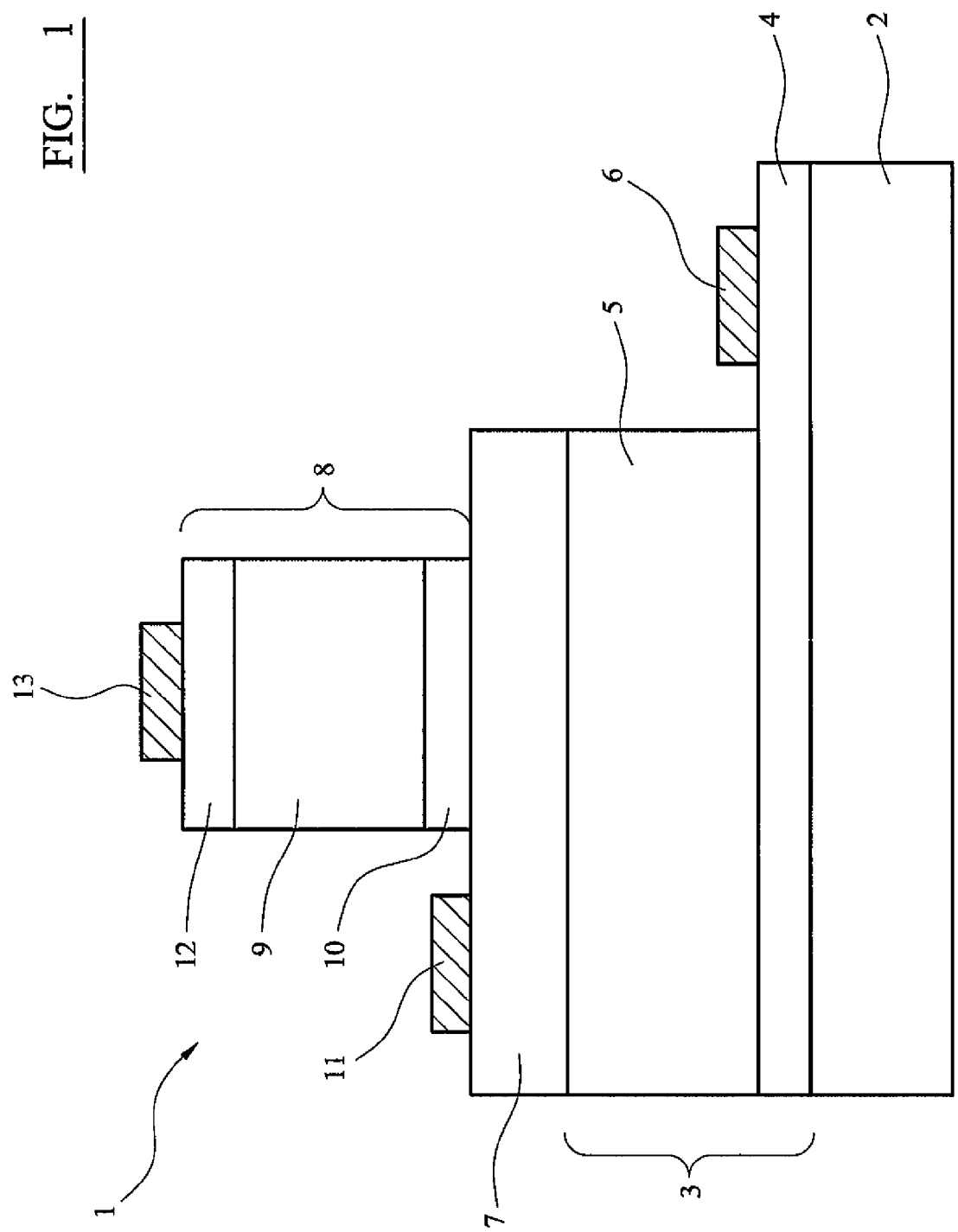
FIG. 1 shows in cross section an embodiment of a heterojunction bipolar transistor according to the invention.

Shown in FIG. 1 is a heterojunction bipolar transistor (HBT) 1 according to the invention. The HBT 1 comprises a semi insulating GaAs substrate 2. On the substrate 2 is a collector 3. The collector 3 comprises an $n^+$GaAs subcollector portion 4 on the substrate 2 and an n-GaAs upper collector portion 5 on the subcollector portion 4. A collector electrode 6 is arranged on the subcollector portion 4 as shown.

On the collector 3 is a $p^+$GaAs base 7. On the base 7 is an emitter 8 comprising upper and lower emitter layers 9,10. The upper emitter layer 9 is GaAs. The lower emitter layer 10 is $Al_xIn_{1-x}P$. x is around 0.5. Also arranged on the base 7 is a base electrode 11 as shown.

Arranged on the upper emitter layer 9 is an InGaAs contact layer 12. An emitter electrode 13 is arranged on the InGaAs contact layer 12.

In an alternative embodiment (not shown) the lower emitter layer 10 is $Ga_xAl_{1-x}P$.

In alternative embodiments x is in the range $0^+$ (i.e. a trace amount of Al or Ga) to 1, preferably in the range 0.05 to 0.95. Values of x around 0.5 are preferred. Throughout the description references to AlInP or GaAlP are to be understood to refer to such compositions. Graded compositions of the layers are also possible.

Figure 2:
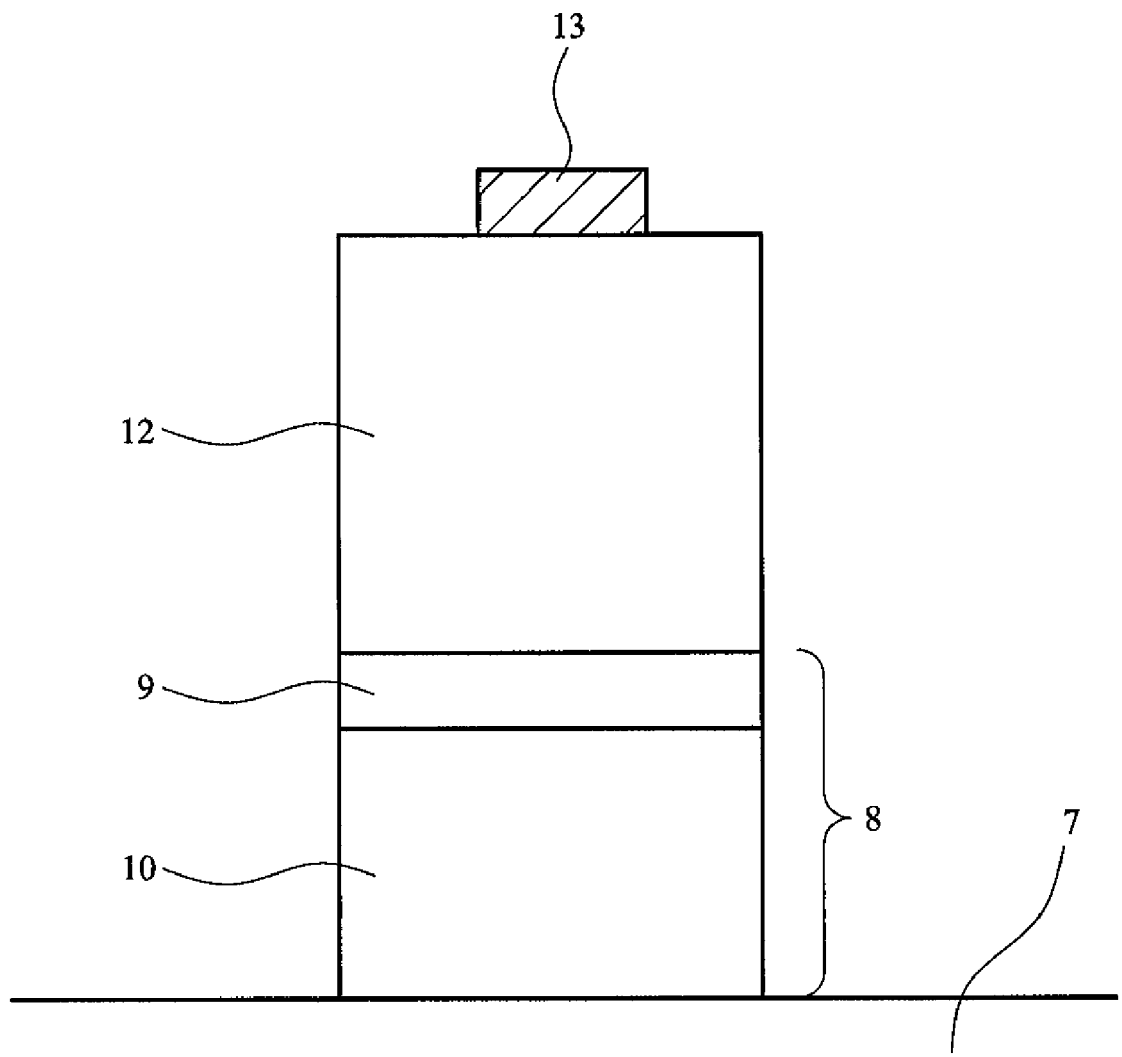
FIG. 2 shows the emitter layer portion of a second embodiment of a HBT according to the invention.

Show in FIG. 2 is the emitter layer portion 8 of a further embodiment of a HBT 1 according to the invention. The lower emitter layer 10 comprises AlInP. A thin GaAs upper emitter layer 9 separates the lower layer 10 from the InGaAs contact layer 12. The thin GaAs layer 9 is required as the lattice mismatch between AlInP and InGaAs is too great for the InGaAs to be deposited directly on the AlInP.

In an alternative embodiment the AlInP layer 10 of FIG. 2 is replaced by GaAlP.

Figure 3:
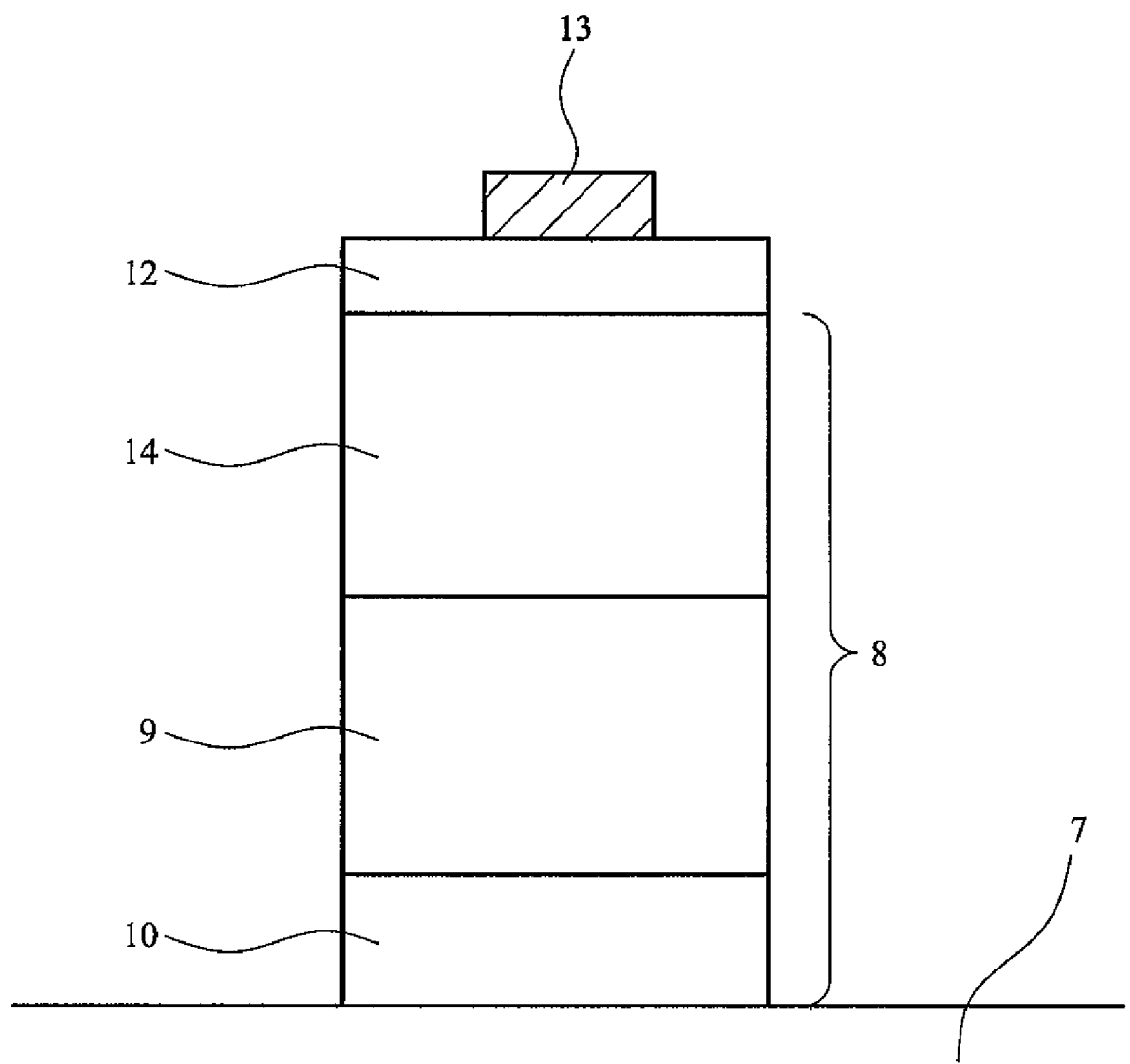
FIG. 3 shows the emitter layer portion of a third embodiment of a HBT according to the invention.

Shown in FIG. 3 is the emitter layer portion 8 of a further embodiment of a HBT 1 according to the invention. This embodiment is similar to that of FIG. 1 except it comprises a graded InGaAs layer 14 between the GaAs upper emitter layer 9 and the InGaAs contact layer 12. In this embodiment the concentration of In in the graded InGaAs layer 14 smoothly increases from 0% to 30% towards the InGaAs contact layer 12. Other values are possible.

In the embodiment of FIG. 3 the InGaAs contact layer 12 is a layer having uniform In concentration on the graded layer 14. In an alternative embodiment (not shown) the contact layer 12 is a top portion of the graded layer 14 and hence the concentration of In varies through the contact layer 12.

Figure 4:
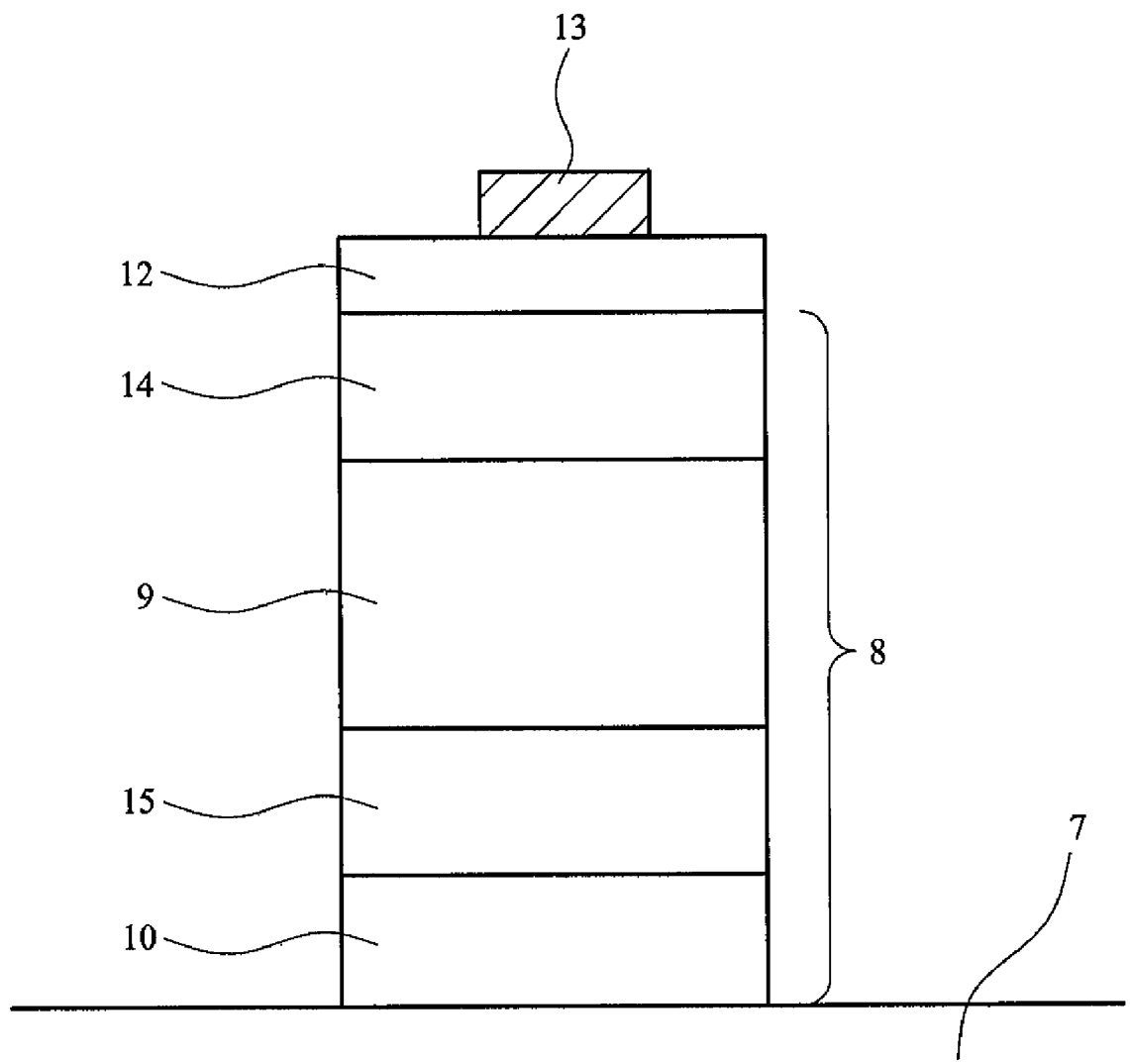
FIG. 4 shows the emitter layer portion of a fourth embodiment of a HBT according to the invention.

Shown in FIG. 4 is the emitter layer portion 8 of a further embodiment of a HBT 1 according to the invention. This embodiment is similar to that of FIG. 3 except it comprises an AlGaAs grading layer 15 between the upper GaAs emitter layer 9 and lower InAlP emitter layer 10. In this embodiment the concentration of the Al in the grading layer 15 increases from 0% to 30% towards the AlInP lower emitter layer 10. Other values are possible.

Figure 5:
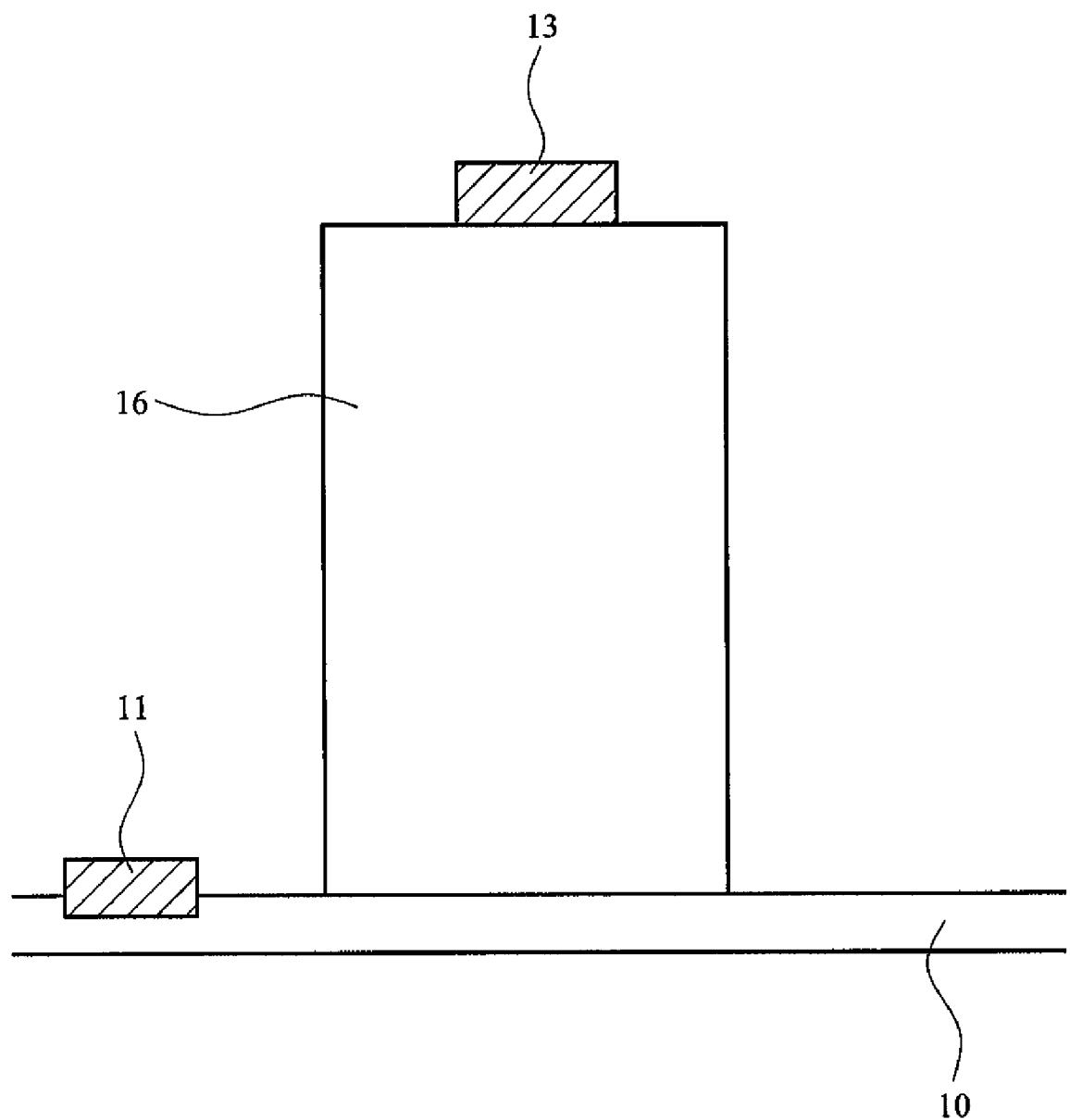
FIG. 5 shows the emitter layer portion of a fifth embodiment of a HBT according to the invention.

Shown in FIG. 5 is a portion of a further embodiment of a HBT 1 according to the invention. In this embodiment the lower emitter layer 10 extends beyond the upper emitter layer 9 as shown to form a covering layer on the base. This covering layer prevents the formation of a surface recombination current which would reduce the gain of the transistor 1. The base electrode 11 is arranged on the covering layer as shown. The upper layer 9 and the layers up to (but not including) the emitter contact 13 are simply shown as a block 16. Any of the arrangement of layers shown in FIG. 2 to 4 are suitable.

In the embodiments above the collector layer 3 is n doped, the base layer 7 is p doped and the emitter layer 8 is n doped (i.e. an npn transistor). In alternative embodiments the transistor can be a pnp transistor with a p doped collector layer 3, n doped base layer 7 and p doped emitter layer 8.

Other compositions for the base layer 7 are possible. Generally, the composition of the base layer 7 is $Ga_{1-x}In_xAs_{1-y}N_y$ with both x and y being in the range 0 to 1.

In further embodiments of the invention (not shown) the HBT 1 of the invention is a double HBT with the collector 3 having a different composition to the base 7. Preferably, the collector 3 is GaAs and the base 7 is $Ga_{1-x}In_xAs_{1-y}N_y$ with x and y each being in the range 0 to 1.

Figure 6:
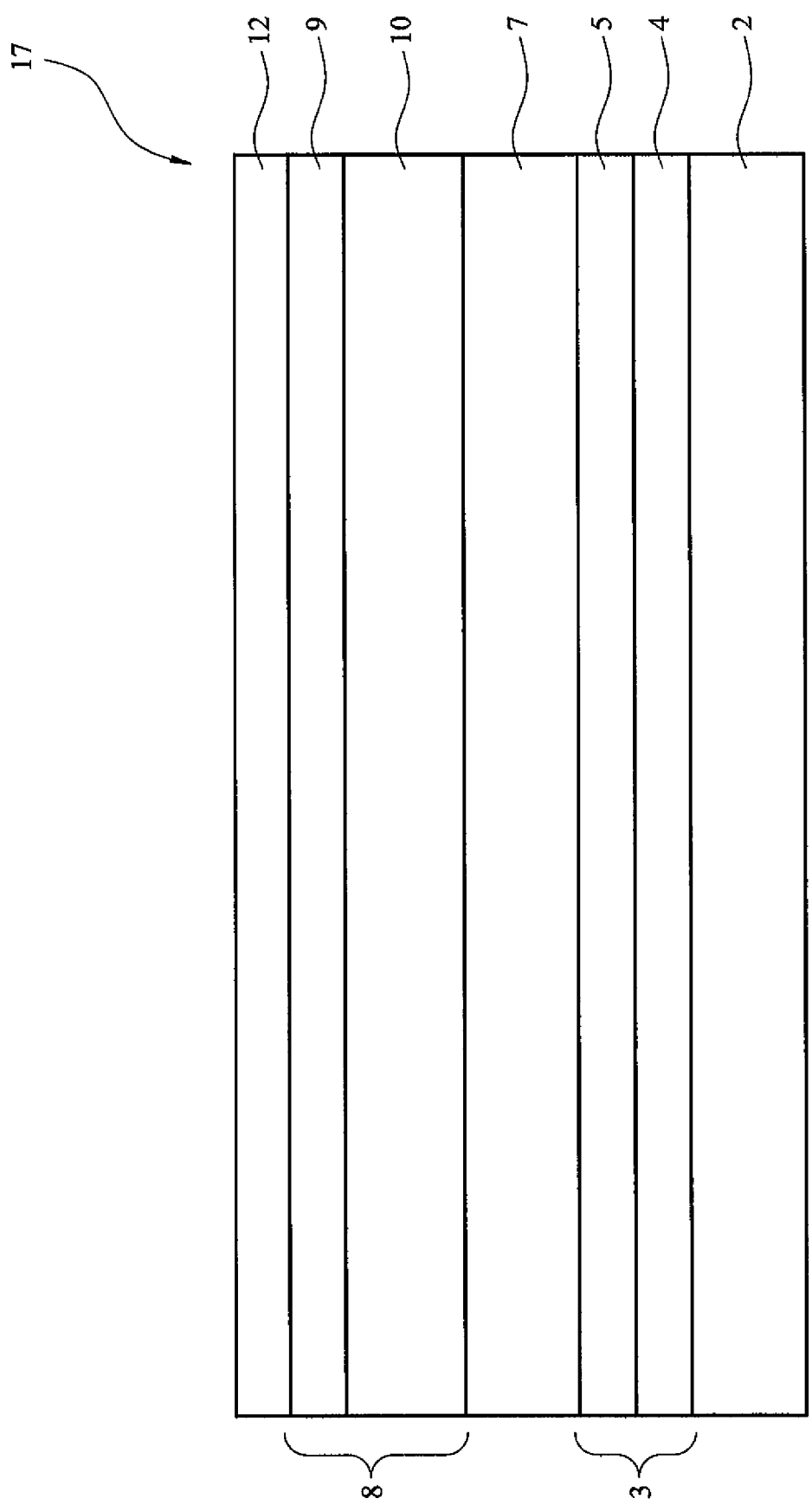
FIG. 6 shows a multilayer semiconductor wafer according to the invention.

Shown in FIG. 6 is a multilayer semiconductor wafer 17 according to the invention. The multilayer semiconductor wafer 17 comprises a semi-insulating GaAs substrate 2. On the substrate 2 is a GaAs collector layer 3. The collector layer 3 is split into a $n^+$GaAs subcollector layer 4 on the substrate 2 and an n-GaAs upper collector portion 5. On the upper collector portion 5 is a $p^+$GaAs base layer 7. On the base layer 7 is an emitter layer 8. The emitter layer is divided into an upper GaAs emitter layer 9 and a lower AlInP emitter layer 10. On the upper emitter layer 9 is an InGaAs contact layer 12. The multilayer semiconductor wafer 17 has the advantage that it can be used to manufacture a heterojunction bipolar transistor 1 by either a wet or dry etching method.

In an alternative embodiment of a multilayer semiconductor wafer 17 according to the invention the lower emitter layer 10 is GaAlP.

In a further embodiment of the invention (not shown) the collector, base and emitter layers 3,7,8 are pnp doped, rather than npn doped.

In a further embodiment of the invention the base layer 7 has a different composition to the collector layer 3. Typically the collector 3 is GaAs and the base layer 7 is $Ga_{1-x}In_xAs_{1-y}N_y$, with x and y each in the range 0 to 1. Such a wafer is useful in the manufacture of a double HBT according to the invention.

In further embodiments of the invention (not shown), the multilayer semiconductor wafer 17 comprises a grading layer 14 between the contact layer 12 and upper emitter layer 9.

Figure 7:
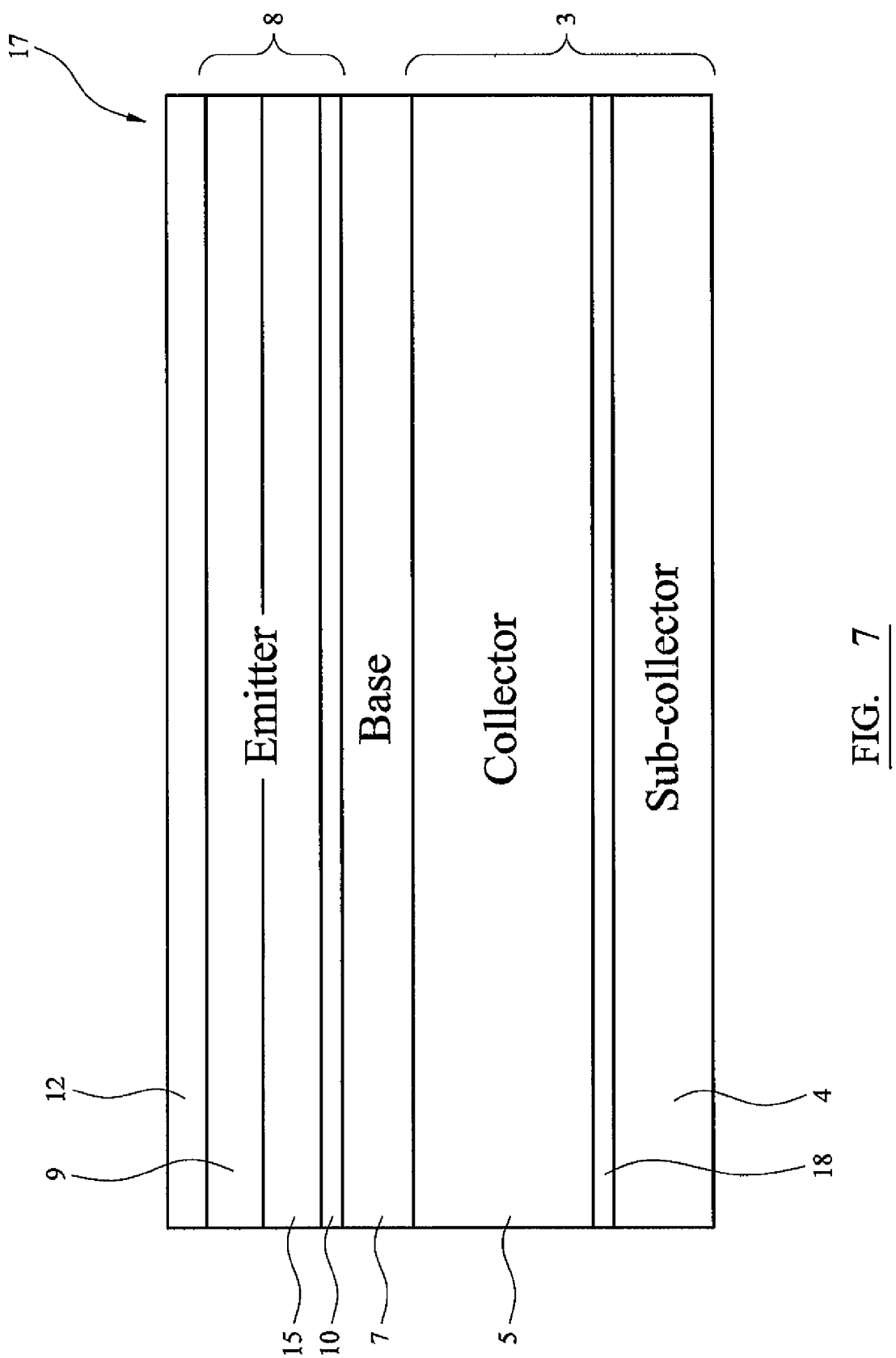
FIG. 7 shows a further embodiment of a multilayer semiconductor wafer according to the invention.

Shown in FIG. 7 is a further embodiment of a multilayer semiconductor wafer 17 according to the invention.

This multilayer semiconductor wafer 17 comprises a substrate (not shown). On the substrate is a collector 3 comprising a GaAs subcollector layer 4 on the substrate and a GaAs upper collector portion 5. Sandwiched between the subcollector layer 3 and upper collector portion 4 is an AlInP etch stop layer 18.

On the collector layer is a $p^+$GaAs base layer 7. On the base layer 7 is an emitter layer 8. The emitter layer 8 comprises an AlInP lower emitter layer 10 and a GaAs upper emitter layer 9. Sandwiched between the upper and lower emitter layers 9, 10 is an AlGaAs grading layer 15. The concentration of Al in the grading layer increases towards the AlInP lower emitter layer 10. On the upper emitter layer 9 is an InGaAs contact layer 12.

The embodiments of FIGS. 1 to 5 are schematic in form simply showing the emitter 8 as rectangular on the base 7. The shape of the emitter 8 however depends upon whether the HBT is manufactured by the wet or dry routes.

Shown in FIGS. 8 to 16 are methods for manufacture for the HBT according to the invention by both wet and dry routes.

Figure 8:
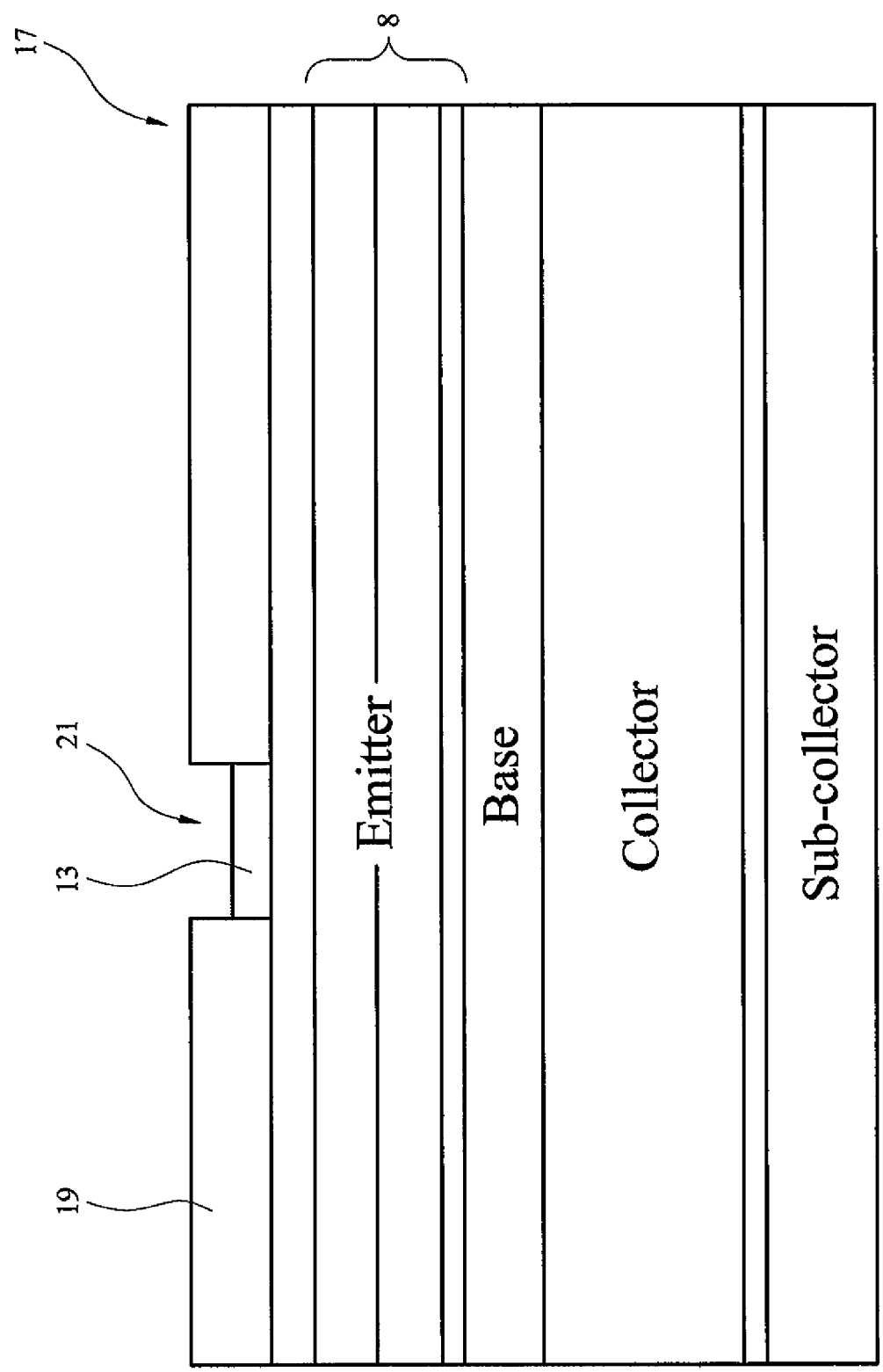

As a first step a photoresist 19 is laid down on the multilayer semiconductor wafer of FIG. 7. The emitter contact 13 is deposited through an aperture 21 in the photoresist 19 onto the contact layer 12. This is shown in FIG. 8.

The photoresist 19 is then removed and a new photoresist 22 deposited covering the emitter contact 13. The exposed areas of the wafer 17 are then etched down to the lower emitter layer 10. This etching step can be done by either a wet or dry etchant and the resulting emitter shape is shown in FIG. 9.

The exposed emitter 8 is then covered with a further photoresist 23 and a further etch performed through the lower emitter layer 10 as shown in FIG. 10. Again, this can be either a wet or dry etch resulting in a different shape of lower emitter layer 10.

A further photoresist layer 24 is laid down on the exposed base 7 as shown in FIG. 11. The base contact 11 is deposited through an aperture 25 in the photoresist 24 as shown.

Figure 12:
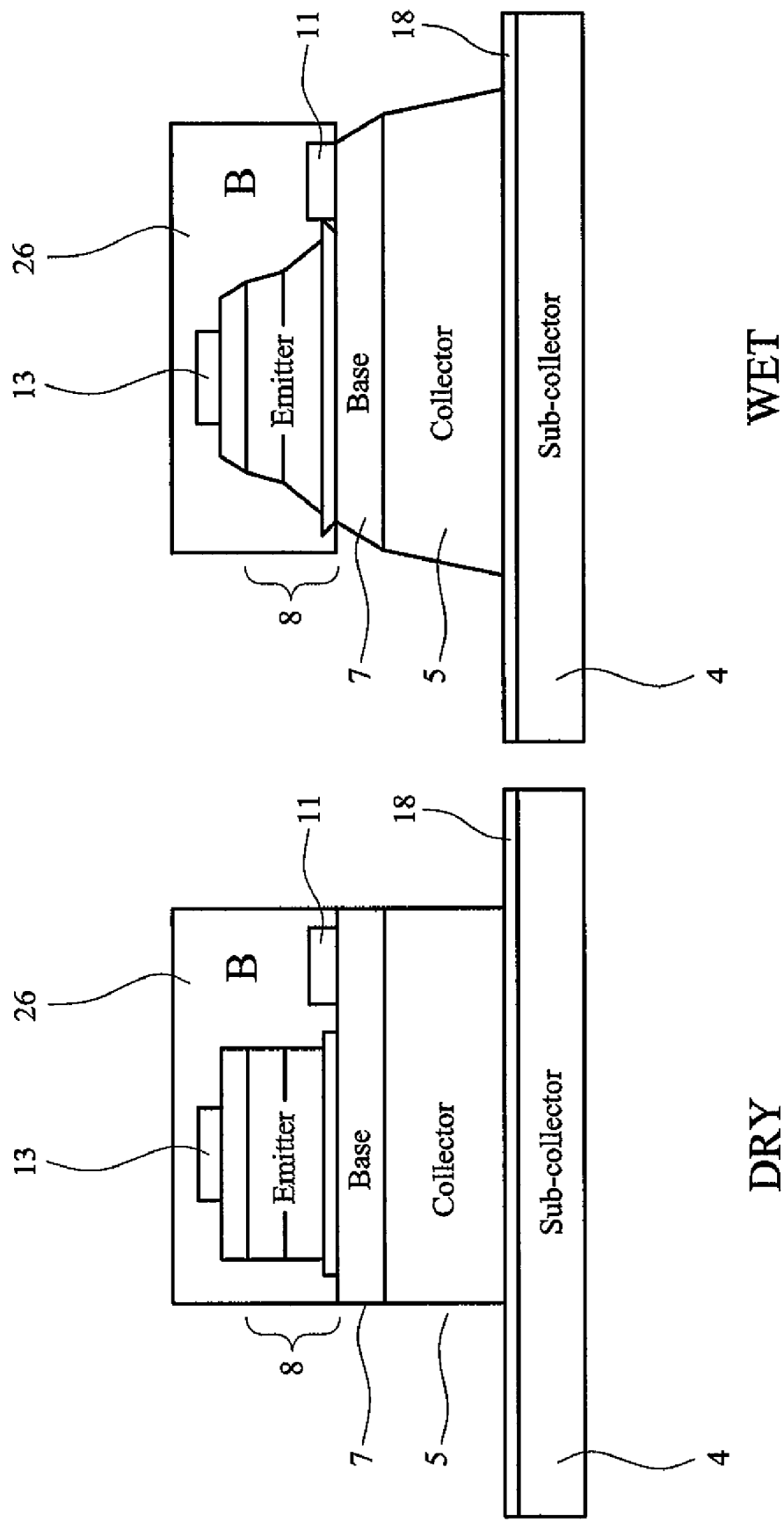

The photoresist 24 is then removed and a further photoresist 26 laid down covering the emitter 8 and base contact 11. A further wet or dry etch is then used to etch through the base 7 and upper collector layer 5 to the AlInP etch stop layer 18. The choice of a wet or dry etchant affects the shape of the etched base 7 and upper collector portion 5 as shown in FIG. 12.

Figure 13:
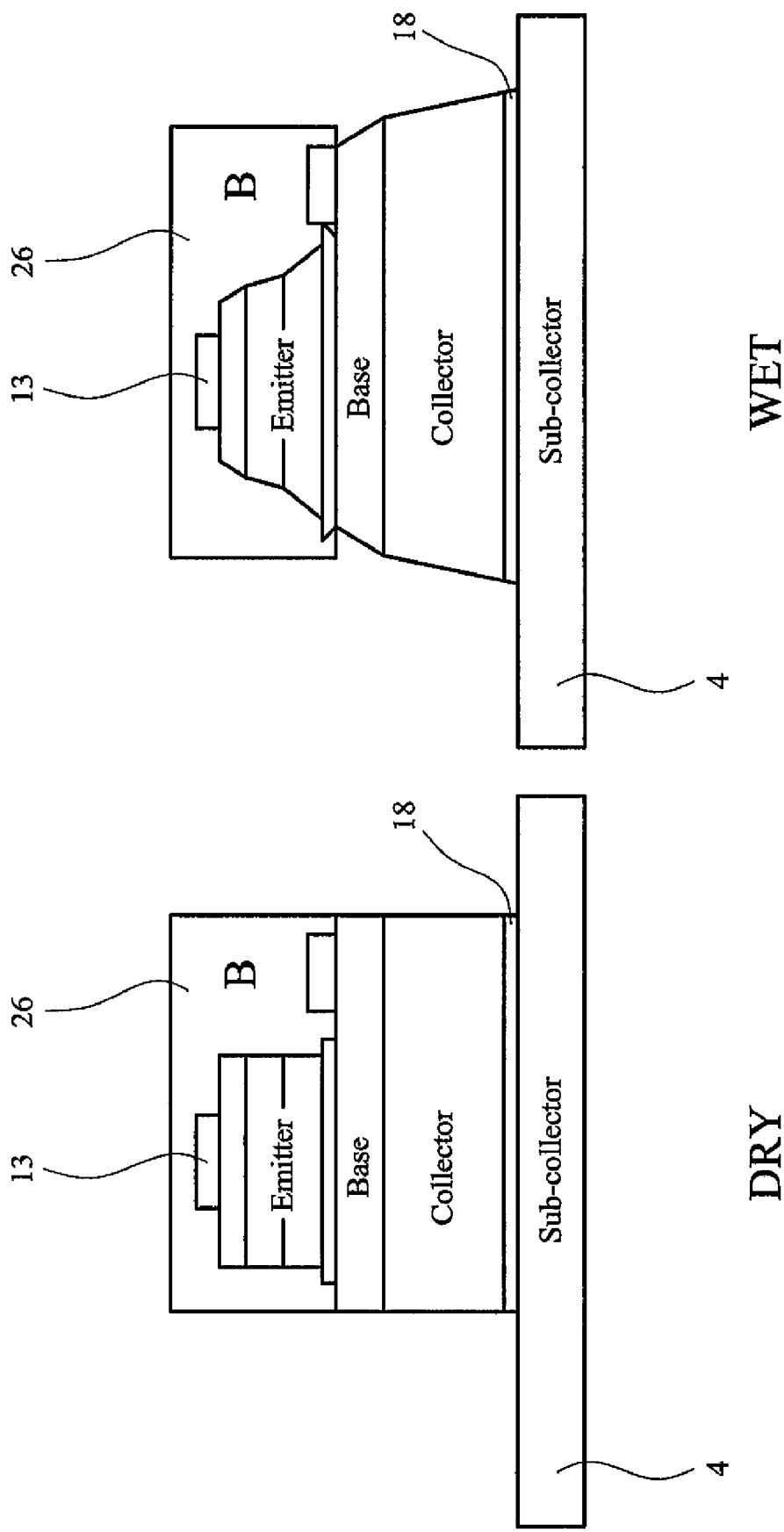

A further etch is then used to etch through the lower etch stop layer 18 to expose the subcollector 4 as shown in FIG. 13.

Figure 14:
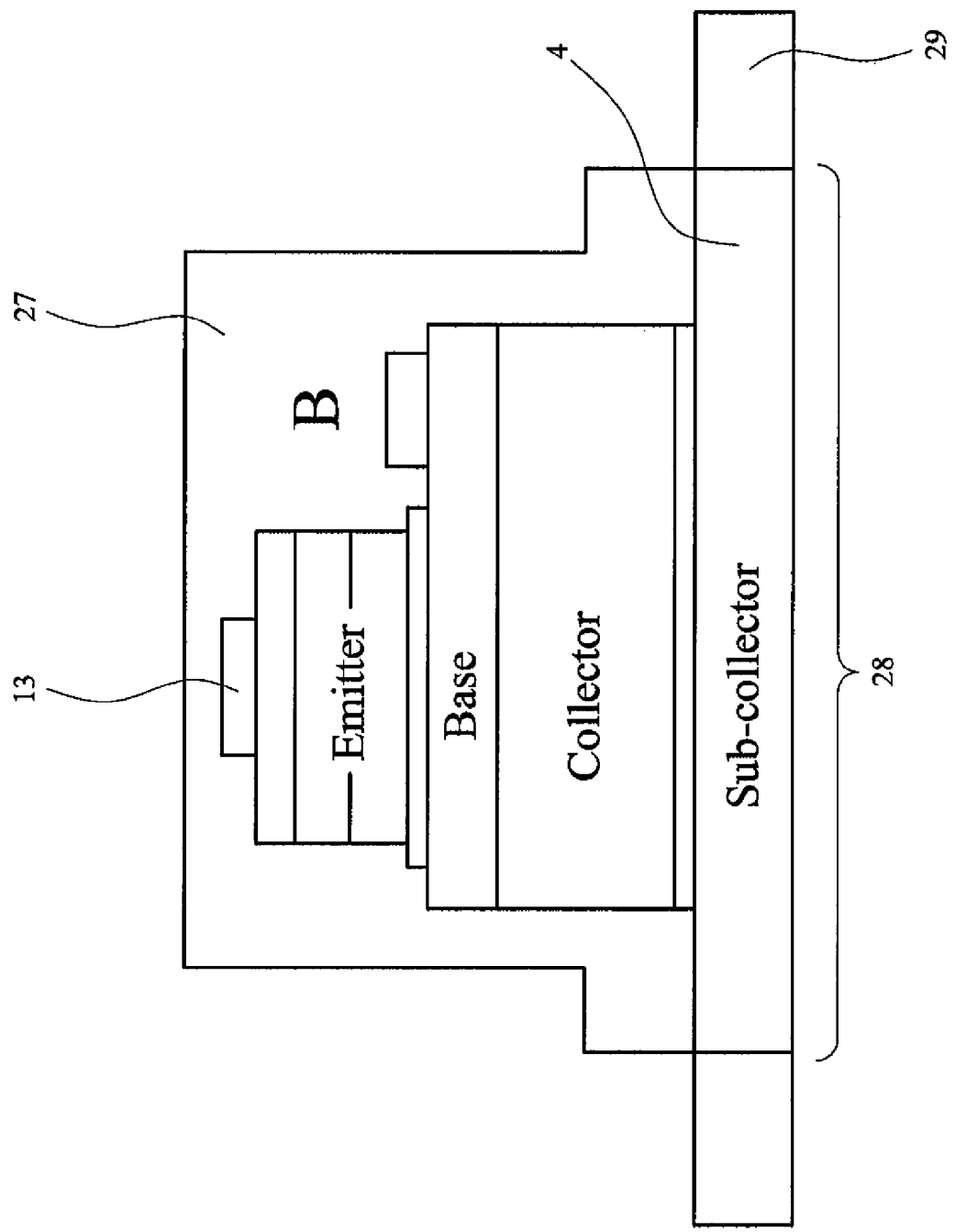

A photoresist layer 27 is laid down covering a portion 28 of the exposed subcollector 4 as shown in FIG. 14. The covered portion 28 is electrically isolated by implant isolation of the surrounding exposed portion of subcollector 29.

Figure 15:
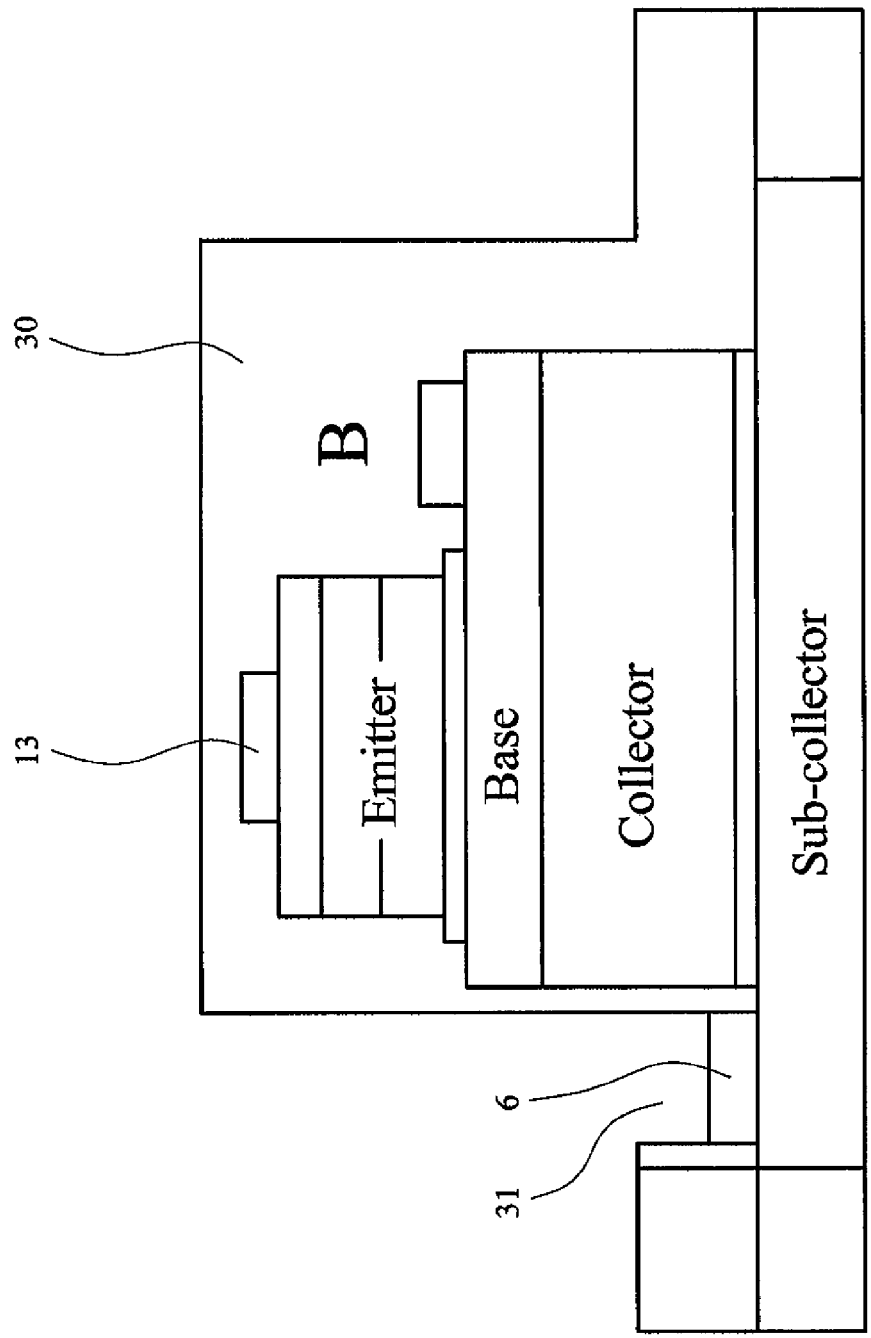

A further photoresist layer 30 is laid down as shown in FIG. 15. The collector contact 6 is deposited on an exposed portion of the subcollector 4 through an aperture 31 on the photoresist 30.

Figure 16:
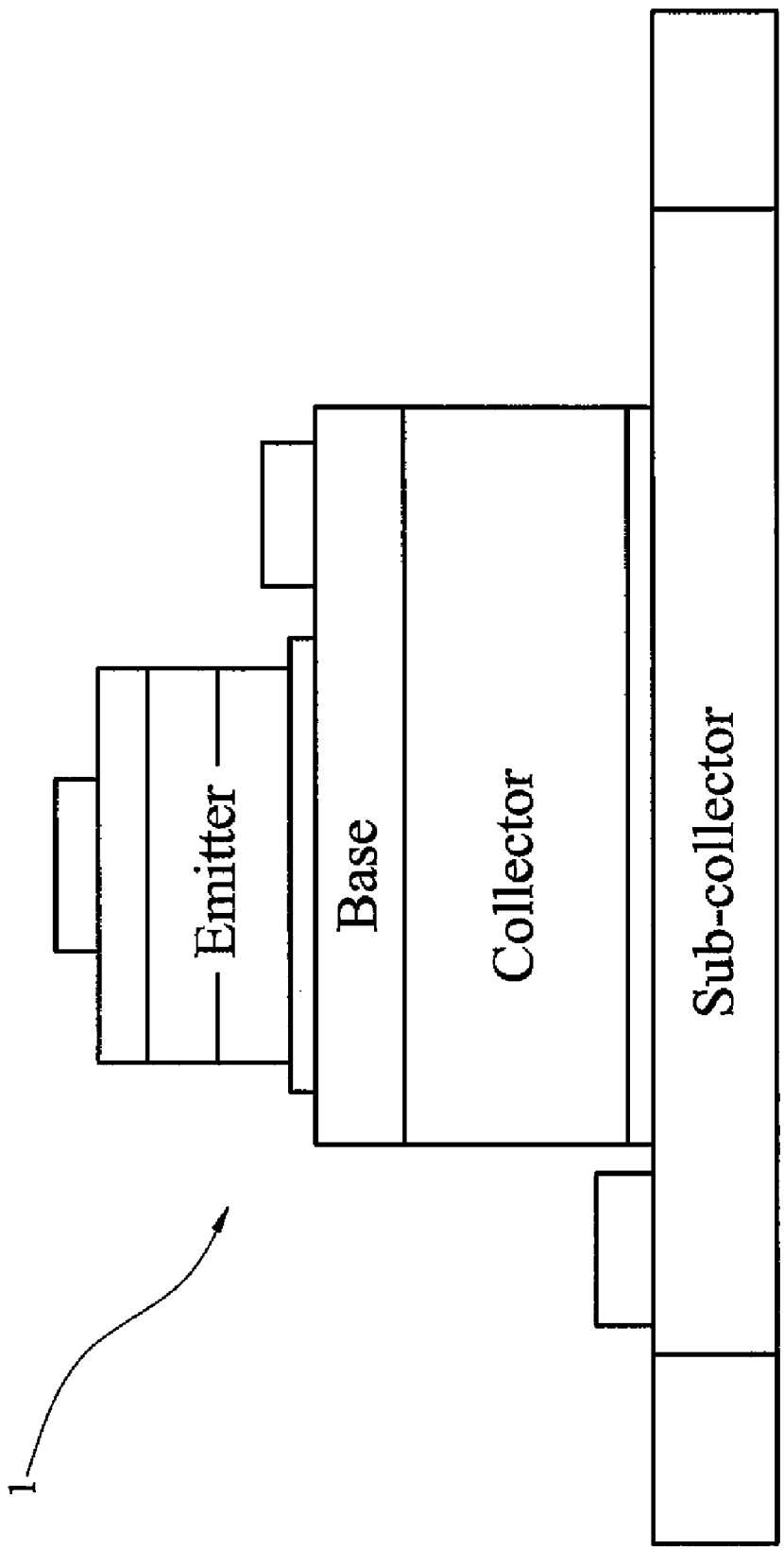

Finally, the photoresist layer 30 is removed to reveal to HBT 1 as shown in FIG. 16.

The steps for FIGS. 14 to 16 are shown with reference to a HBT 1 manufactured by the dry route only. The steps are equally applicable to a HBT 1 manufactured by the wet etching route.

As can be seen from FIGS. 8 to 16 the final shape for the HBT 1 depends upon whether a wet or dry etchant route is employed. Different shaped HBTs 1 have different properties and hence one chosen the route depending upon the final intended application for the HBT 1.

The invention claimed is:

1. A heterojunction bipolar transistor comprising:
   a substrate;
   a collector on the substrate;
   a base layer on the collector; an emitter layer on the base layer;
   the emitter layer comprising an upper emitter layer and a lower emitter layer between the upper emitter layer and the base layer;
   the collector, base and emitter layers being npn or pnp doped respectively;
   characterised in that the lower emitter layer has a larger bandgap than the base layer and is $Al_xIn_{1-x}P$ such that $0<x<1$.

2. A heterojunction bipolar transistor as claimed in claim 1 wherein x is in the range 0.05 to 0.95.

3. A heterojunction bipolar transistor as claimed in claim 1 wherein the transistor is an npn transistor with the collector and emitter layers being n doped and the base layer being p doped.

4. A heterojunction bipolar transistor as claimed in claim 1 wherein the transistor is a pnp transistor with the collector and emitter layers being p doped and the base layer being n doped.

5. A heterojunction bipolar transistor as claimed in claim 1 wherein the upper emitter layer is GaAs.

6. A heterojunction bipolar transistor as claimed in claim 5, wherein the emitter further comprises an AlGaAs grading layer between the GaAs upper emitter layer and the lower emitter layer.

7. A heterojunction bipolar transistor as claimed in claim 6 further comprising an InGaAs contact layer on the emitter layer.

8. A heterojunction bipolar transistor as claimed in claim 7, further comprising an emitter electrode on the contact layer.

9. A heterojunction bipolar transistor as claimed in claim 7 further comprising an InGaAs graded composition layer between the InGaAs contact layer and the emitter layer.

10. A heterojunction bipolar transistor as claimed in claim 1 further comprising a base electrode on the base layer.

11. A heterojunction bipolar transistor as claimed in claim 1 wherein the lower emitter layer extends beyond the upper emitter layer in the plane of the base to form a covering layer on the base, the heterojunction bipolar transistor further comprising a base electrode on the covering layer.

12. A heterojunction bipolar transistor as claimed in claim 1 wherein the base layer is $Ga_{1-x}In_xAs_{1-y}N_y$, with x and y each being in the range 0 to 1.

13. A heterojunction bipolar transistor as claimed in claim 12, wherein the base is GaAs.

14. A heterojunction bipolar transistor as claimed in claim 1 wherein the collector is GaAs.

15. A heterojunction bipolar transistor as claimed in claim 14, wherein the collector is divided into an upper collector portion and a subcollector portion.

16. A heterojunction bipolar transistor as claimed in claim 15, when dependant on claim 6, wherein the upper collector portion is n-GaAs and the subcollector is n$^+$GaAs.

17. A heterojunction bipolar transistor as claimed in claim 15 comprising an etch stop layer between the upper collector and sub collector portions.

18. A heterojunction bipolar transistor as claimed in claim 17 wherein the etch stop layer comprises $Al_xIn_{1-x}P$, x being in the range 0$^+$ to 1.

19. A heterojunction bipolar transistor as claimed in claim 17, wherein the etch stop layer comprises $Ga_xIn_{1-x}P$, x being in the range 0$^+$ to 1.

20. A heterojunction bipolar transistor as claimed in claim 17, wherein the etch stop layer comprises $Al_xIn_{1-x}P$, x being in the range 0.05 to 0.95.

21. A heterojunction bipolar transistor as claimed in claim 17, wherein the etch stop layer comprises $Al_xIn_{1-x}P$, x being in the range 0.4 to 0.6.

22. A heterojunction bipolar transistor as claimed in claim 17, wherein the etch stop layer comprises $Al_xIn_{1-x}P$, x being 0.5.

23. A heterojunction bipolar transistor as claimed in claim 17, wherein the etch stop layer comprises $Ga_xIn_{1-x}P$, x being in the range 0.05 to 0.95.

24. A heterojunction bipolar transistor as claimed in claim 17, wherein the etch stop layer comprises $Ga_xIn_{1-x}P$, x being in the range 0.4 to 0.6.

25. A heterojunction bipolar transistor as claimed in claim 17, wherein the etch stop layer comprises $Ga_xIn_{1-x}P$, x being 0.5.

26. A heterojunction bipolar transistor as claimed in claim 15 further comprising a collector electrode on the subcollector portion.

27. A heterojunction bipolar transistor as claimed in claim 1 wherein the substrate is a semi insulating GaAs substrate.

28. A heterojunction bipolar transistor as claimed in claim 1, wherein x is in the range 0.4 to 0.6.

29. A heterojunction bipolar transistor as claimed in claim 1, wherein x is 0.5.

30. A multilayer semiconductor wafer comprising:
a substrate;
a collector layer on the substrate;
a base layer on the collector layer;
an emitter layer on the base layer;
the emitter layer comprising an upper emitter layer and a lower emitter layer between the upper emitter layer and the base layer;
the collector, base and emitter layers being npn or pnp doped respectively;
characterized in that the lower emitter layer has a larger bandgap than the base layer and is $Al_xIn_{1-x}P$, such that 0<x<1.

31. A multilayer semiconductor wafer as claimed in claim 30 wherein x is in a range 0.05 to 0.95.

32. A multilayer semiconductor wafer as claimed in claim 30 wherein the upper emitter layer is GaAs.

33. A multilayer semiconductor wafer as claimed in claim 32, further comprising an AlGaAs grading layer between upper emitter layer and lower emitter layer.

34. A multilayer semiconductor wafer as claimed in claim 30 further comprising an InGaAs contact layer on the upper emitter layer.

35. A multilayer semiconductor wafer as claimed in claim 34 further comprising an InGaAs graded composition layer between the contact layer and upper emitter layer.

36. A multilayer semiconductor wafer as claimed in claim 30 wherein the collector and emitter layers are n doped and the base layer is p doped.

37. A multilayer semiconductor wafer as claimed in claim 30 wherein the collector and emitter layers are p doped and the base layer is n doped.

38. A multilayer semiconductor wafer as claimed in claim 30, wherein x is in the range 0.4 to 0.6.

39. A multilayer semiconductor wafer as claimed in claim 30, wherein x is 0.5.

40. A PNP heterojunction bipolar transistor comprising:
a substrate;
a collector layer on the substrate;
a base layer on the collector layer;
an emitter layer on the base layer;
the emitter layer comprising an upper emitter layer and a lower emitter layer between the upper emitter layer and the base layer;
the collector and emitter layers being p doped;
the base layer being n doped; and
characterised in that the lower emitter layer has a larger bandgap than the base layer and is $Ga_xAl_{1-x}P$, such that 0<x<1.

* * * * *